United States Patent [19]

Konishi

[11] Patent Number: 4,583,202
[45] Date of Patent: Apr. 15, 1986

[54] SEMICONDUCTOR MEMORY DEVICE

[75] Inventor: Satoshi Konishi, Tokyo, Japan

[73] Assignee: Tokyo Shibaura Denki Kabushiki Kaisha, Kawasaki, Japan

[21] Appl. No.: 520,189

[22] Filed: Aug. 4, 1983

[30] Foreign Application Priority Data

Aug. 6, 1982 [JP] Japan ................................ 57-136905

[51] Int. Cl.⁴ .............................................. G11C 13/00
[52] U.S. Cl. ..................................... 365/189; 365/230
[58] Field of Search ............... 365/174, 182, 189, 190, 365/230

[56] References Cited

U.S. PATENT DOCUMENTS 3,402,398  9/1968  Koerner et al. ...................... 365/182
4,044,341  8/1977  Stewart et al. ....................... 365/182

FOREIGN PATENT DOCUMENTS 55-67993  4/1980  Japan .

Primary Examiner—Terrell W. Fears
Attorney, Agent, or Firm—Schwartz, Jeffery, Schwaab, Mack, Blumenthal & Evans

[57] ABSTRACT

In a semiconductor memory cell of the type in which memory cells are arranged in a matrix, the present invention discloses a novel construction of a word line which interconnects a plurality of memory cell in one row. Each word line is divided at least at one point into a first word line and a second word line which are electrically isolated from each other and a first switching circuit is interconnected between the first and second word lines. When each word line is selected, the first switching circuit is responsive to a select signal propagated from the first word line so as to increase the potential of the second word line to a predetermined select level and when each word line is deselected, the first switching circuit causes the potential of the second word line to a deselect level in synchronism with a deselect signal. A second switching circuit is connected to the input end or the terminal end of the second word line so as to cause the potential of the second word line to a deselect level in synchronism with a deselect signal which is different from said first mentioned select signal.

19 Claims, 15 Drawing Figures

SEMICONDUCTOR MEMORY DEVICE

BACKGROUND OF THE INVENTION

The present invention relates to a semiconductor device and more particularly a semiconductor device being capable of operating at a high speed.

It is essential for the improvement of performance of computer systems to operate memory devices at a high speed by shortening the access time.

In semiconductor memory devices, time delay of a select or deselect signal derived from a decoder and propagated on a word line (to be referred to as "the word line time delay" in this specification) is dependent upon the material of a word line and the size of a transistor which constitutes a transfer gate. That is, a signal propagation time is dependent upon the resistance of a word line and the capacitance produced because the word line is connected to a plurality of transfer gates for memory cells or the capacitance produced because the word line functions as a plurality of transfer gates for memory cells. Therefore, a time period from the time when an output from a decoder appears at its output terminal to the time when the output reaches the transfer gate farthest from the decoder; that is, the word line time delay td is given by $$td \approx CR \qquad (1)$$

where R is the resistance from one end of a word line; that is, the output of a decoder to the other or terminal end of the word line; and C is the capacitance of the word line.

Meanwhile semiconductor devices with more elements are fabricated in order to increase the memory capacity. As the number of memory cells is increased, the capacitance C is also increased and the word lines are increased in length so that the resistance R is also increased. Therefore, as is clear from Eq. (1), it is readily understood that in the high-density memory cells the word line time delay td is remarkably increased. Such long word line time delay td in memory devices prevents the high speed operation of the computer systems.

Therefore, there have been devised and demonstrated various methods and devices for shortening the word line time delay td, but none of them is satisfactory in practice. That is, the switching the memory cell from selection mode to deselection mode is slow so that information is erroneously stored in the deselected memory cell.

SUMMARY OF THE INVENTION

Objects

One of the objects of the present invention is to provide a semiconductor device which can substantially eliminate the above and other defects encountered in the prior art semiconductor memory cells.

Another object of the present invention is to provide a semiconductor memory cell which can operate at high speed.

Summary

To the above and other ends, according to the present invention each word line is divided into at least two sections (One section on the side of a decoder will be referred to as "a first word line" while the other section, as "a second word line" in this specification.) which are electrically isolated from each other. A first switching circuit is interconnected between the first and second word lines and a second switching circuit is connected to the input or terminal end of the second word line. When each word line is selected, the first switching circuit amplifies a select signal transmitted from the first word line, thereby increasing the voltage of the second word line and consequently attaining the high speed select operation. When each word line is deselected, the first switching circuit causes the rapid drop of the potential of the second word line in synchronism with a deselect signal. When each word line is deselected, the second switching circuit causes the rapid drop of the potential of the second word line to a non-select level; that is, a potential level at which the word line is maintained to be in non-select state.

The synchronous operation of both the first and second switching circuits is controlled by a control signal which is generated in synchronism with a deselect signal applied to a word-line driving circuit. Both the first and second switching circuits may be provided in the form of a C-MOS (Complementary MOS), an E/D (Enhancement and Depletion), an E/E (Enhancement and Enhancement type) or an E/I (Enhancement and Intrinsic (zero threshold voltage) type) transistor circuit.

When only the first switching circuit is provided, the potential of a word line cannot be dropped in a short time when the word line is deselected, but when the second switching is added in accordance with the present invention, the potential of the word line can be rapidly dropped to a non-select level. Thus the high speed deselect operation of a word line can be accomplished. That is, in response to a control signal which is generated in synchronism with a deselect signal applied to a word line or to a word-line driving circuit, the second switching circuit causes the potential of the second word line to a non-select level.

For each word line has been described as being divided into two sections, but it is to be understood that depending upon the number of memory cells, each word line may be divided into two or more sections. And first switching circuits and second switching circuits may be disposed in a manner substantially similar to that described above.

Effects of the Invention

According to the present invention, therefore, when a word line is selected, a select signal is propagated with a predetermined time delay on the word signal to a memory cell to be selected. In this case, the select signal is amplified by the first switching circuit interconnected between the first and second word lines so that the potential of the second word line is forced to rise. As a result, the select-signal propagation velocity is effectively increased. When a selected word line is switched to a non-selected mode or state, in response to an externally applied deselect signal, the potential of the second word line drops through the first switching circuit. Moreover, in response to a deselect signal which is propagated on a word line with a predetermined delay, the second switching circuit forces the voltage of the second word line to fall through the second switching circuit. Therefore, the deselect-signal propagation velocity is effectively increased. As a result, according to the present invention, not only a word line can be rapidly changed into the select mode but also it can be rapidly done into the non-select mode. Therefore, the present invention can avoid such erratic operation that the information to be stored into a selected memory cell and the information to be stored into a deselected memory cell coexist on the same bit line so that the information is erroneously written into the deselected memory cell. Thus the object of the present invention for high speed selection and deselection of a desired word line can be accomplished.

Figure 1:
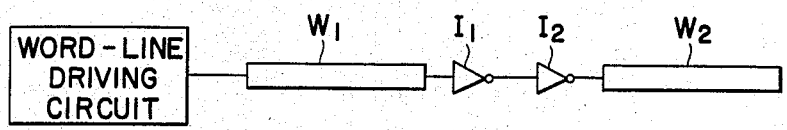
FIGS. 1 through 3 are views used to explain a prior art semiconductor memory cells.
Figure 2:
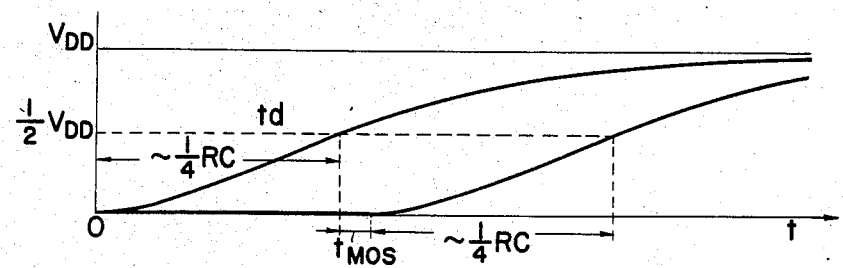
Figure 3:
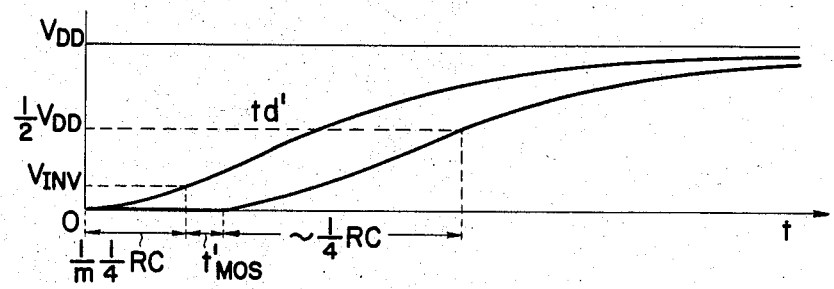
Figure 4:
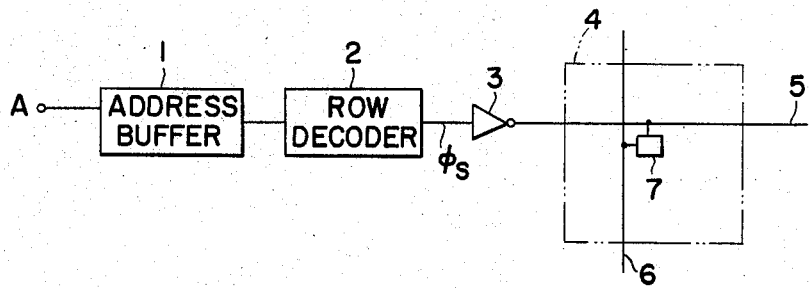
FIG. 4 is a view used to explain the underlying principle of the present invention.
Figure 5:
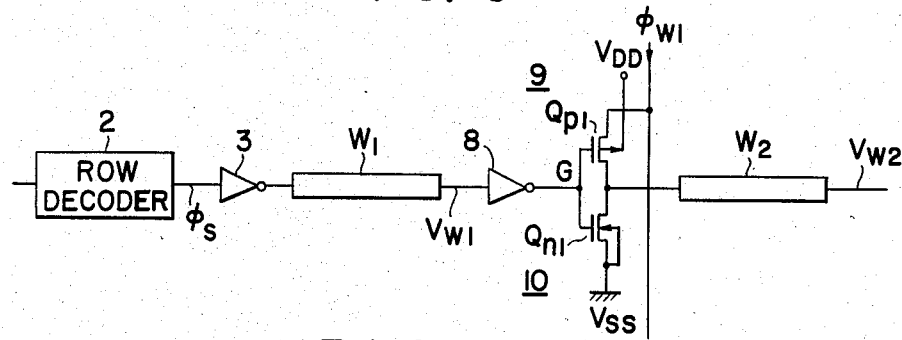
FIGS. 5 through 14 are views, respectively, to explain various embodiments of the present invention.
Figure 7:
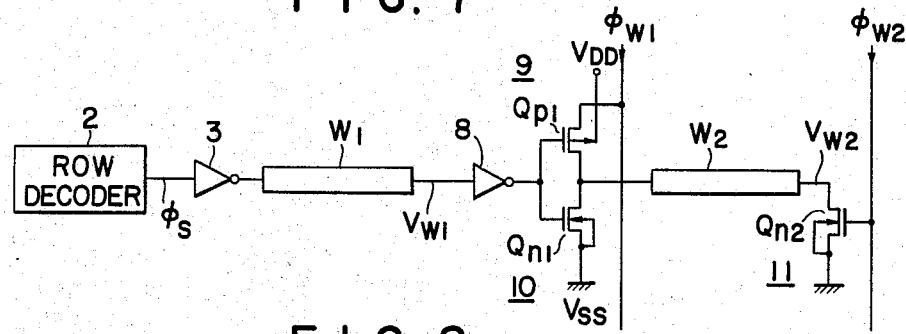
Figure 8:
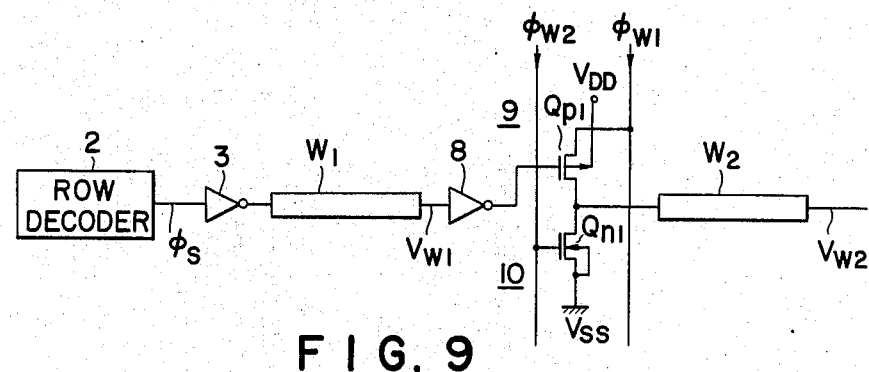
Figure 9:
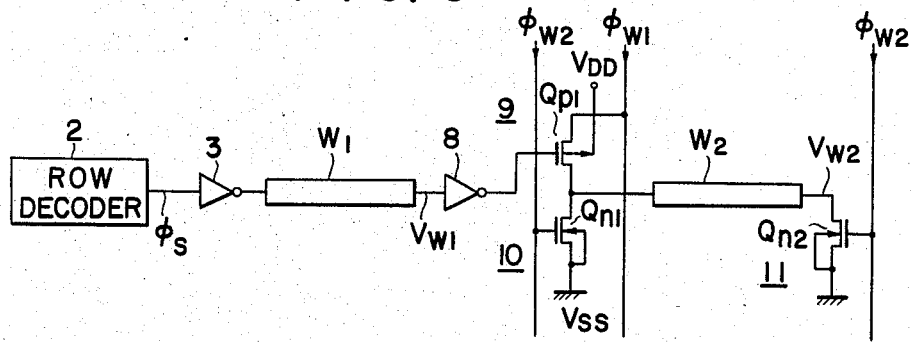
Figure 10:
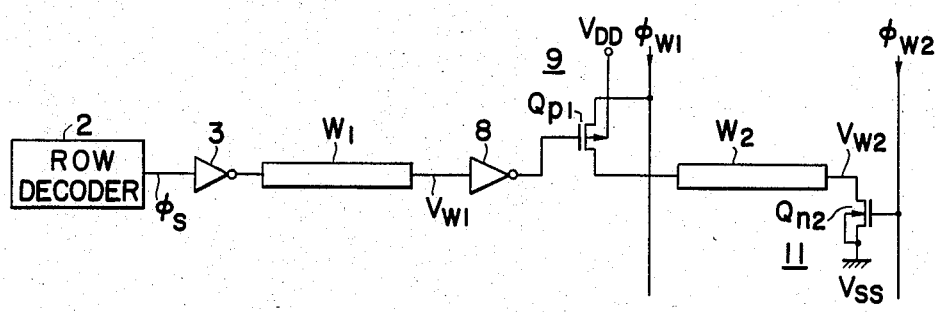
Figure 11:
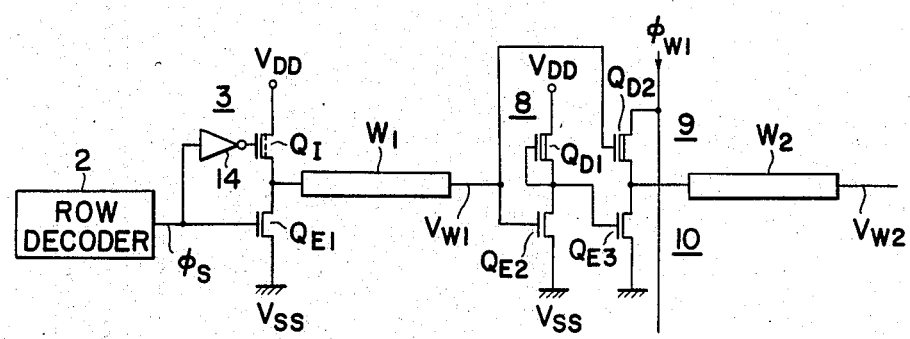
Figure 12:
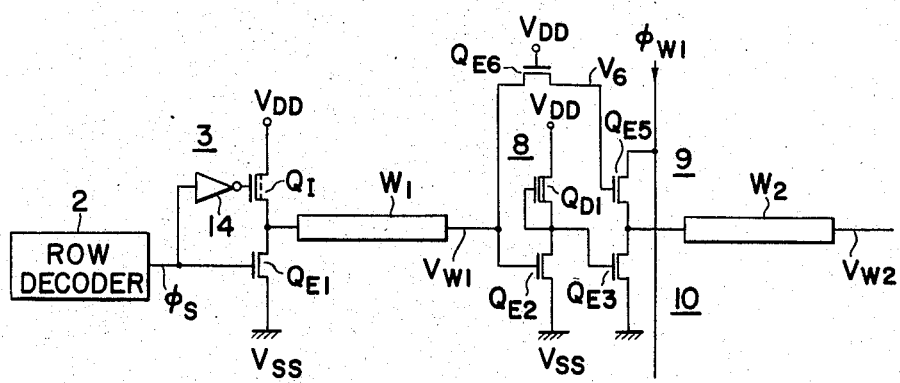
Figure 13:
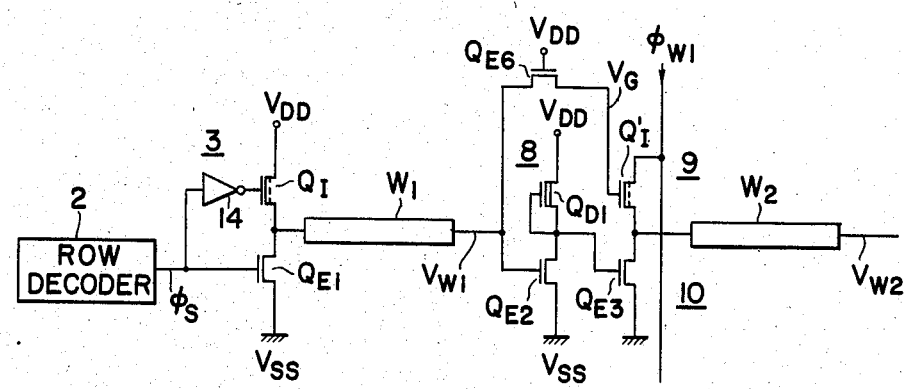
Figure 14:
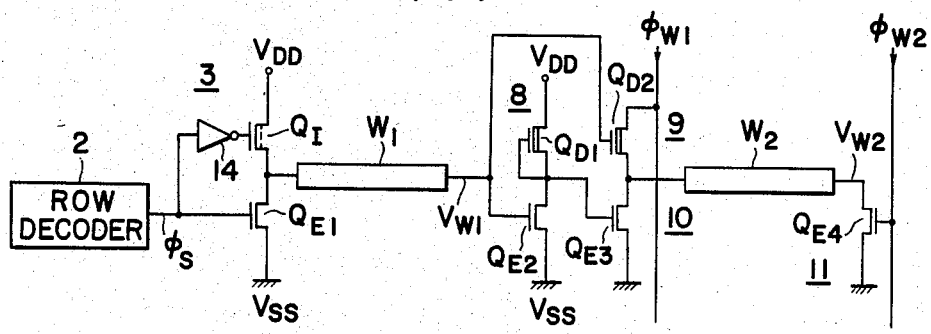
Figure 15:
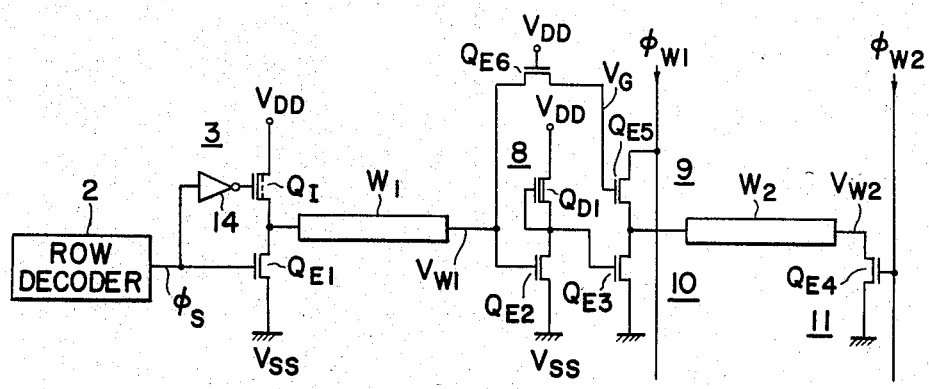

More particularly,

FIG. 1 is a block diagram which shows two inverters for amplifying a word-line signal are interconnected between a first word line and a second word line into which is divided a word line in accordance with the prior art;

FIG. 2 is a view used to explain a word line delay time td caused by the arrangement as shown in FIG. 1;

FIG. 3 is a view used to explain a word line time delay td' when input inversion voltage (input voltage at which the output voltage of the inverter changes) of a first inverter as shown in FIG. 1 is lowered;

FIG. 4 is a block diagram of a core part of a RAM employing dynamic or static cells used to explain the underlying principle of the present invention;

FIG. 5 is a circuit diagram of a first embodiment of the present invention;

FIGS. 6(a) through (f) are views used to explain the mode of operation of the first embodiment;

FIG. 7 is a circuit diagram of a second embodiment of the present invention;

FIG. 8 is a circuit diagram of a third embodiment of the present invention;

FIG. 9 is a circuit diagram of a fourth embodiment of the present invention;

FIG. 10 is a circuit diagram of a fifth embodiment of the present invention;

FIG. 11 is a circuit diagram of a sixth embodiment of the present invention;

FIG. 12 is a circuit diagram of a seventh embodiment of the present invention;

FIG. 13 shows a modification of the seventh embodiment of the present invention;

FIG. 14 is a circuit diagram of an eighth embodiment of the present invention; and FIG. 15 is a circuit diagram of a ninth embodiment of the present invention.

Same reference numerals are used to designate similar parts throughout the figures.

DETAILED DESCRIPTION OF THE INVENTION

Prior Art

Before the description of the preferred embodiments of the present invention, a prior art semiconductor memory device will be briefly described in order to point out the problems encountered in the prior art semiconductor devices.

In order to reduce the word-line time delay td, according to the prior art, a word line is divided into two sections $W_1$ and $W_2$ as shown in FIG. 1 and two series-connected inverters $I_1$ and $I_2$ are interconnected between the two sections $W_1$ and $W_2$ so that the value of resistance R and the value of capacitance C as viewed from a word-line driving circuit may be reduced. The reason why the word-line time delay td can be reduced when the inverters $I_1$ and $I_2$ are interconnected between the sections $W_1$ and $W_2$ is as follows. A word line may be regarded as a distributed circuit with spatially distributed resistance and capacitance. It takes a predetermined time before a signal which is derived from a word line driving circuit reaches to the end of the word line opposite to the word line driving circuit at a predetermined voltage level. However, the signal from the word-line driving circuit can be amplified from low signal level to high signal one by the two inverters $I_1$ and $I_2$ so that a time required for the signal reaching the end of word line at a predetermined level can be shortened.

The time delay td will be described in more detail with reference to FIG. 2. The word line time delay td is the sum of a time delay of the word line $W_1$, a time delay of the word line $W_2$ and a time delay due to the two inverters $I_1$ and $I_2$ and is given by $$td = R/2 \cdot C/2 + T_{MOS} + R/2 \cdot C/2 = RC/2 + t_{MOS} \quad (2)$$

where $t_{MOS}$ is a time delay due to the two inverters $I_1$ and $I_2$ and has a very small value as compared with RC/2. The comparison of Eq. (2) with Eq. (1) shows that when a word line is divided into two sections and two inverters $I_1$ and $I_2$ are interconnected between them, the word line time delay td can be shortened.

However, the reduction of time delay in this divided word line is not enough. In order to attain more high speed operation, it is so arranged that the inverted input voltage applied to the first inverter $I_1$ is lowered and the first inverter $I_1$ can invert the signal even when the potential of the first word line $W_1$ rises slightly. Therefore, the word line signal, which is inverted and amplified by the second inverter $I_2$, can reach the end of the second word line $W_2$ remote from the word line driving circuit within a short time period (see FIG. 3). In this case the word line time delay td' is given by $$td' = 1/m \cdot R/2 \cdot C/2 + t_{MOS}' + R/2 \cdot C/2 \quad (3)$$
$$= 1/4(1/m + 1)RC + t_{MOS}'$$

where $t_{MOS}'$ is a time delay due to the inverters $I_1$ and $I_2$; and
m represents the reduction in time delay as a result of the lowering of the input inversion voltage of the inverter $I_1$ and is given by $$m \simeq (\tfrac{1}{2} \cdot V_{DD})/V_{INV} > 1 \quad (4)$$

where $V_{DD}$ is a power supply voltage; and
$V_{INV}$ represents an input voltage at which an output signal derived from the first inverter $I_1$ is inverted.

A word line time delay td'' which is required for completing the deselect operation can be obtained by substituting $V_{INV} = V_{DD} - V_{INV}$ in Eq. (4). That is, $$td'' = \tfrac{1}{4}(3 - 1/m)RC + t_{MOS} \quad (5)$$

where m is defined as the same quantity given in Eq. (4). However, when the input inversion voltage $V_{INV}$ is lowered in order to shorten the word line time delay in selection mode, the following problem arises. That is, when $V_{INV}$ is lowered, the potential of the first word line $W_1$ must be pulled down to a level lower than $V_{INV}$ in the deselection mode of word line, which leads to the necessity of a long time for deselection operation. In quantitative representation, the greater the value of m (as defined in Eq. (4)), the longer the word line time delay td″ required for the deselect operation than the word line time delay td′ required for the select operation, as is clear from Eqs. (3) and (5). This means that before the potential of one word line drops so that the word line is placed into the non-selected state, the potential of another word line rises so that the word line is placed in the selected state. Therefore, both the data stored in a memory cell which is being switched to the non-selected state and the data stored in an accessed memory cell appear at the same time on a bit line through a transfer gate transistor. This leads to the erratic operation that fault information is stored in a memory cell which is being switched from the selected state to the non-selected state.

The Invention

Prior to the description of the preferred embodiments, the underlying principle of the present invention will be described with reference to FIG. 4 which shows in block diagram a core portion of a RAM employing a dynamic or static memory cell.

An address specification signal A is applied to an address buffer 1 which converts the address specification signal A to an internal signal level so as to be accepted in a memory chip. The output from the address buffer 1 is applied to a row decoder 2 which decodes the address specification signal A. The output signal $\phi s$ from the decoder 2 is applied to a driving circuit 3 so as to select one word line in a memory cell array 4. In this case, the driving circuit 3 comprises an inverter. When a word line is selected, the potential of the output signal $\phi s$ from the decoder falls to a relatively negative power supply potential $V_{SS}$ and becomes logical "L". On the other hand, in the case of the deselection mode, the decoder output signal $\phi s$ rises to a relatively positive power supply potential $V_{DD}$ and becomes logical "H".

In FIG. 4 only one word line 5 and only one bit line 6 are shown, but it is to be understood that a plurality of word lines may be extended in the row direction while a plurality of bit lines 6 may be extended in the column direction as is well known in the art. Reference numeral 7 designates a dynamic or static memory cell. In the case of a static memory cell, a pair of bit lines are provided for a plurality of memory cells arranged in one column.

Figure 6:
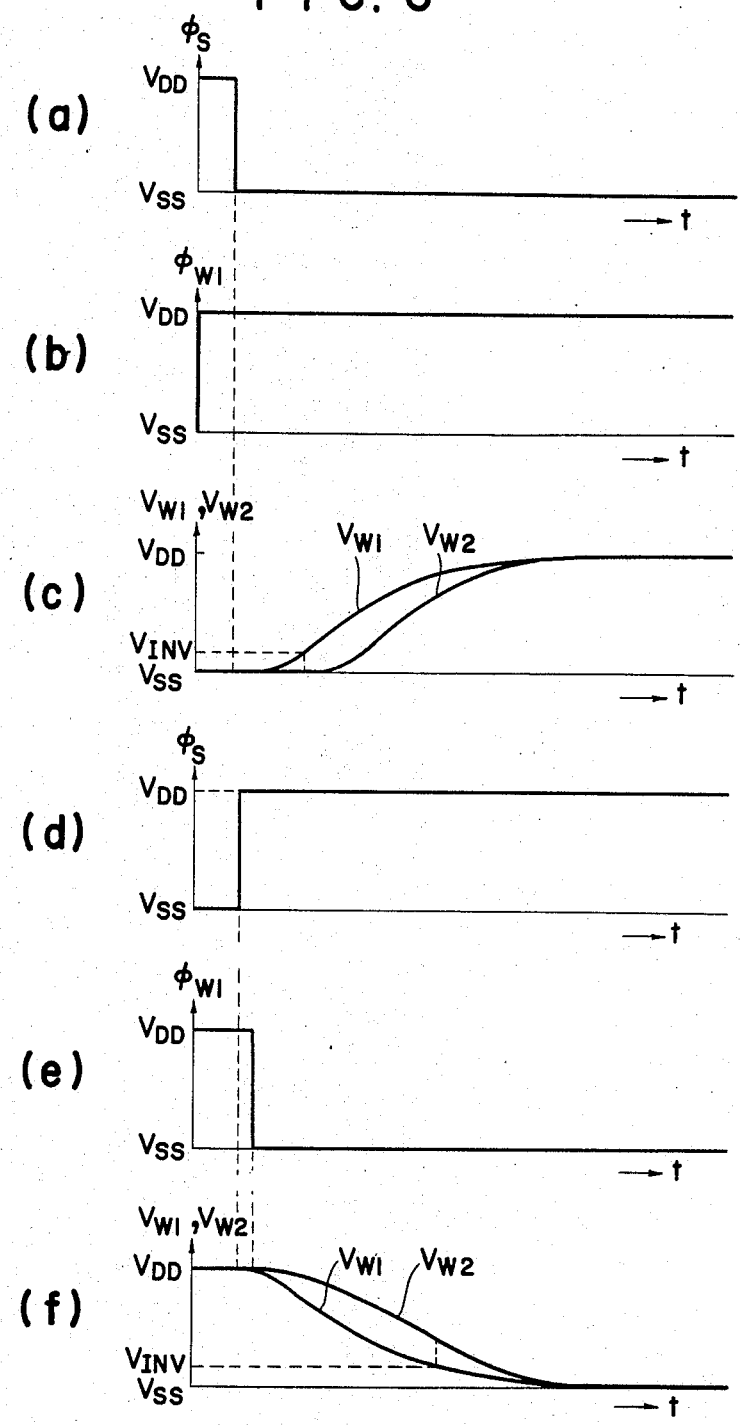

First Embodiment, FIGS. 5 and 6

In FIG. 5 is shown a first embodiment of the present invention. A word line (which corresponds to the word line 5 as shown in FIG. 4) is divided into two sections; that is, a first word line $W_1$ and a second word line $W_2$ which are electrically isolated from each other. In the first and other embodiments, the present invention will be described in conjunction with a word line which is divided into two sections.

The first and second word lines $W_1$ and $W_2$ are interconnected through an inverter 8 and a first switching circuit 9 and a second switching circuit 10, both of which are connected in series.

The inverter 8 functions as an amplifier and serves to amplify and drop the voltage of the decoder output signal $\phi s$ propagated on the first word line $W_1$. Therefore, the reduction in time delay can be attained as described before. The inverter 8 comprises, for instance, a C-MOS transistor.

The first and second switching circuits 9 and 10 constitute a C-MOS inverter. A p-channel type transistor $Q_{p1}$ constitutes the first switching circuit while an n-channel type transistor $Q_{n1}$, the second switching circuit. The gates of the transistors $Q_{p1}$ and $Q_{n1}$ are connected together to the output of the inverter 8. The drains of the transistors $Q_{p1}$ and $Q_{n1}$ are connected together to the input of the second word line $W_2$. A power supply voltage $V_{DD}$ is applied to the substrate terminal of the transistor $Q_{p1}$ while a power supply voltage $V_{SS}$ is applied to the substrate terminal and source of the transistor $Q_{n1}$. A control signal $\phi_{w1}$ is applied to the source of the transistor $Q_{p1}$ and falls in synchronism with the decoder output signal (that is, the rise of $\phi s$) in the deselect mode.

Next referring to FIG. 6, the mode of operation of the first embodiment will be described. In the selection mode, the output signal is derived from the row decoder 2 falls from $V_{DD}$ to $V_{SS}$ (See FIG. 6(a)). Then the output from the driving circuit 3 is inverted and becomes $V_{DD}$ and the potential $V_{w1}$ at the end of the first word line $W_1$ rises to $V_{DD}$ with a time constant which depends upon the values of R and C of the first word line $W_1$ (See FIG. 6(c)). In this case, the control signal $\phi_{w1}$ maintains the same potential as $V_{DD}$ (See FIG. 6(b)). When the potential at the end of the first word line $W_1$ rises to an input inversion voltage $V_{INV}$ of the inverter 8, the output therefrom drops to $V_{SS}$. As a result, the gate voltage of the transistor $Q_{p1}$ becomes $V_{SS}$ and the transistor $Q_{p1}$ is turned on. The control signal $\phi_{w1}$ applied to the source of the transistor $Q_{p1}$ is $V_{DD}$ so that the potential of the second word line $W_2$ is raised to $V_{DD}$ through the transistor $Q_{p1}$. As a result the potential $V_{w2}$ at the end of the word line $W_2$ rises to $V_{DD}$ with a predetermined time constant (See FIG. 6(c)). Since $V_{SS}$ is applied to the gate of the transistor $Q_{n1}$, it is turned off so that the potential of the second word line $W_2$ will not drop from $V_{DD}$; that is, the potential of the second word line $W_2$ is maintained at $V_{DD}$. Because of the amplification of the selection signal by the inverter 8 and the voltage rise due to the transistor $Q_{p1}$, a time required for increasing the potential $V_{w2}$ at the end of the second word line $W_2$ to a predetermined level can be shortened.

In the deselection mode, the output $\phi s$ from the row decoder rises from $V_{SS}$ to $V_{DD}$ (See FIG. 6(d)). Then the output from the driving circuit 3 is inverted to $V_{SS}$ and the output potential $V_{w1}$ of the first word line $W_1$ falls to $V_{SS}$ with a predetermined time constant (See FIG. 6(f)). In this case, (strictly speaking, with some time lag) the control signal $\phi_{w1}$ falls from $V_{DD}$ to $V_{SS}$ (See FIG. 6(e)). At the initial stage of the deselection mode, the gate voltage of the transistor $Q_{p1}$ is still $V_{SS}$ so that the transistor $Q_{p1}$ is still turned on. Since the control signal $\phi_{w1}$ becomes $V_{SS}$, the potential at the input end of the second word line $W_2$ drops to $V_{SS}$ through the transistor $Q_{p1}$, but it will not become completely equal to $V_{SS}$. The reason is as follows. The gate and source voltage of the transistor $Q_{p1}$ is $V_{SS}$. Accordingly, the drain voltage of the transistor $Q_{p1}$ becomes higher than $V_{SS}$ by the absolute value of a threshold voltage of the transistor $Q_{p1}$. However, a deselect signal propagated through the first word line $W_1$ soon becomes less than $V_{INV}$ so that the output of the inverter 8 changes to $V_{DD}$ and $V_{DD}$ is applied to the gate of the transistor $Q_{n1}$. As a result, the transistor $Q_{n1}$ is turned on so that a current flows from its drain to source and consequently the drain potential (that is, the potential at the input end of the second word line $W_2$) is completely discharged and drops to $V_{SS}$ (See FIG. 6(f)).

When only one word line is taken into consideration, as soon as the deselect signal $\phi_s$ is derived from the row decoder 2, the control signal $\phi_{w1}$ falls so that the potential of the second word line $W_2$ falls. Therefore as soon as the decoder output $\phi_s$ causes the fall of the potential of the first word line $W_1$, the potential of the second word line $W_2$ falls in response to the control signal $\phi_{w1}$. This means that the word line is quickly driven into the non-selected state and that the coexistence of the data in a deselected memory cell and the data in a selected memory cell on the same bit line can be avoided. While, according to the prior art, the switching to the deselection mode of a word line lags behind the switching to the selection mode so that the data in a deselected memory cell and the data in a selected memory cell are simultaneously present on the same bit line.

Second Embodiment, FIG. 7

In FIG. 7 is shown a second embodiment of the present invention which is substantially similar in construction to the first embodiment as shown in FIG. 5 except that a switching circuit 11 which functions in a manner substantially similar to that of the switching circuit 10 is provided at the end of the second word line $W_2$.

The end of the second word line $W_2$ is connected to the drain of an n-channel MOS transistor $Q_{n2}$ and a power supply voltage $V_{SS}$ is applied to the source and substrate terminal thereof. A control signal $\phi_{w2}$ (which is different from the control signal $\phi_{w1}$ and will be referred to as "the second control signal") is applied to the gate of the transistor $Q_{n2}$. The second control signal $\phi_{w2}$ is generated in synchronism with the rise of the decoder output signal $\phi_s$ and is in opposite phase with respect to the first control signal $\phi_{w1}$. The switching circuit 11 comprising the transistor $Q_{n2}$ performs the same function as the second switching circuit 10 at the input end of the second word line $W_2$. While the second switching circuit 10 drops the potential of the word line $W_2$ from its input end, the switching circuit 11 does at its terminal end.

The mode of operation of the second embodiment will be described as follows. In the selection mode, the second control signal $\phi_{w2}$ is maintained at $V_{SS}$ so that the transistor $Q_{n2}$ is kept off. In the deselection mode, decoder output signal $\phi_s$ rises from $V_{SS}$ to $V_{DD}$ so that the first word line $W_1$ is driven to $V_{SS}$ by the word line driving circuit 3 and, at the same time, the potential of the word line is dropped from the input end of the second word line $W_2$ in response to the first control signal $\phi_{w1}$ by means of the transistor $Q_{p1}$ as described before with reference to the first embodiment. In this case, the second control signal $\phi_{w2}$ which is applied to the gate G of the transistor $Q_{n2}$ rises to $V_{DD}$ so that the transistor $Q_{n2}$ is turned on. As a result the potential of the word line $W_2$ falls at its end to $V_{SS}$ so that according to the second embodiment, the potential of the second word line $W_2$ falls from its input and terminal ends, whereby the word line can be changed into the deselected state at a higher speed.

Third Embodiment, FIG. 8

In FIG. 8 is shown a third embodiment of the present invention which is substantially similar in construction to the first embodiment as shown in FIG. 5 except that the second switching circuit 10 is not responsive to the output from the inverter 8 but is responsive to the second control signal $\phi_{w2}$. That is, the second control signal $\phi_{w2}$ is applied to the gate of the transistor $Q_{n1}$ which constitutes the second switching circuit 10. The second control signal $\phi_{w2}$ is generated in synchronism with the first control signal $\phi_{w1}$ and is in opposite phase with respect to the first control signal $\phi_{w1}$. In the deselection mode or state, the potential of the second word line $W_2$ must be lowered to $V_{SS}$. In this case, the second control signal $\phi_{w2}$ rises to $V_{DD}$ so that the transistor $Q_{n1}$ is turned on. Therefore the potential of the second word line $W_2$ is lowered from $V_{DD}$ to $V_{SS}$ from its input end.

As described above, the second switching circuit 10 is directly turned on by means of the second control signal $\phi_{w2}$ so that as compared with the first embodiment in which the operation of the second switching circuit 10 is controlled by the output from the inverter 8, the potential of the second word line $W_2$ can be dropped quickly and consequently the high speed operation may be ensured. The reason is as follows. In the deselection mode, the fall of the potential of the second word line $W_2$ is caused by the discharge through the transistor $Q_{p1}$ to the control signal $\phi_{w1}$ which is changed to $V_{SS}$ and by the simultaneous discharge through the transistor $Q_{n1}$ to the $V_{SS}$ power supply, both.

Fourth Embodiment, FIG. 9

In FIG. 9 is shown a fourth embodiment of the present invention which is a combination of the second embodiment as shown in FIG. 7 with the third embodiment as shown in FIG. 8. The fourth embodiment is different from the first embodiment as shown in FIG. 5 in that the second switching circuit 10 is controlled in response to the second control signal $\phi_{w2}$ and that a second switching circuit 11 is connected to the terminal end of the second word line $W_2$ and is operated in response to the second control signal $\phi_{w2}$.

According to the fourth embodiment, in the deselection mode, in response to the rise of the second control signal $\phi_{w2}$ to $V_{DD}$, both the transistors $Q_{n1}$ and $Q_{n2}$ are turned on so that the potential of the second word line $W_2$ can be rapidly lowered to $V_{SS}$.

Fifth Embodiment, FIG. 10

In FIG. 10 is shown a fifth embodiment of the present invention which is substantially similar in construction to the fourth embodiment as shown in FIG. 9 except that the second switching circuit 10 is eliminated. In other words, the fifth embodiment is different from the first embodiment as shown in FIG. 5 in that the second switching circuit 11 is not interconnected between the first and second word lines $W_1$ and $W_2$, but is connected to the terminal end of the second word line $W_2$. The first switching circuit 9 is controlled in response to the first control signal $\phi_{w1}$ while the second switching circuit 11 is controlled in response to the second control signal $\phi_{w2}$. The mode of operation of the fifth embodiment will be easily understood from the description of the first through fourth embodiments so that no further description shall be made in this specification.

Sixth Embodiment, FIG. 11

In FIG. 11 is shown a sixth embodiment of the present invention. In the first through fifth embodiments, C-MOS transistors are used, but in the sixth and seventh embodiments, E/D transistors are used. As is well known in the art, the E/D transistor comprises an enhancement (E) type transistor and a depletion (D) type one.

The driving circuit 3 comprises an inverter 14 and an intrinsic type transistor $Q_I$ whose threshold voltage is 0 V and an E type transistor $Q_{E1}$. The power supply voltage $V_{DD}$ is applied to the drain of the transistor $Q_I$, and the source of the transistor $Q_I$ and the drain of the transistor $Q_{E1}$ are connected together to the input end of the first word line $W_1$. The power supply voltage $V_{SS}$ is applied to the source of the transistor $Q_{E1}$.

An inverter 8 comprises a depletion type transistor $Q_{D1}$ and an E type transistor $Q_{E2}$. That is, the inverter 8 is of E/D type inverter. The power supply voltage $V_{DD}$ is applied to the drain of the transistor $Q_{D1}$ and the gate and source of the transistor $Q_{D1}$ are connected together to the drain of the transistor $Q_{E2}$. The gate of the transistor $Q_{E2}$ is connected to the output end of the first word line $W_1$ and the power supply voltage $V_{SS}$ is applied to the source of the transistor $Q_{E2}$.

A first switching circuit 9 comprises a D type transistor $Q_{D2}$. The gate of the transistor $Q_{D2}$ is connected to the output end of the first word line $W_1$ and the source of the transistor $Q_{D2}$ is connected to the drain of an E type transistor $Q_{E3}$ and to the input end of the second word line $W_2$. The first control signal $\phi_{w1}$ is applied to the drain of the transistor $Q_{D2}$.

The second switching circuit 10 comprises the E type transistor $Q_{E3}$. The gate of the transistor $Q_{E3}$ is connected to the junction between the source of the transistor $Q_{D1}$ and the drain of the transistor $Q_{E2}$. The power supply voltage $V_{SS}$ is applied to the source of the transistor $Q_{E3}$.

The mode of operation of the sixth embodiment will be described as follows. In the selection mode, the output signal $\phi_s$ derived from the decoder 3 falls to $V_{SS}$ so that the transistor $Q_{E1}$ is turned off and $V_{DD}$ is applied through the inverter 14 to the gate of the transistor $Q_I$ so that the latter is turned on so that the potential at the input end of the first word line becomes $V_{DD}$. The voltage $V_{DD}$ is propagated as a selection signal to the output end with a predetermined time constant. When the output voltage $V_{w1}$ rises to some extent, the drain voltage of the transistor $Q_{E2}$ falls to $V_{SS}$ even when the transistor $Q_{D1}$ is kept turned on so that the transistor $Q_{E3}$ is turned off. The transistor $Q_{D2}$ has a negative threshold voltage whose absolute value is about $(V_{DD}-V_{SS})$ so that the transistor $Q_{D2}$ is normally turned on. Especially because a stepped-up voltage is applied to the gate of the transistor $Q_{D2}$ from the first word line $W_1$, the transistor $Q_{D2}$ has a high conductance in the selected word line. In this case, the first control voltage $\phi_{w1}$ is $V_{DD}$ so that the voltage $V_{DD}$ is applied through the transistor $Q_{D2}$ to the input end of the second word line $W_2$. That is, the word line is placed into the selected state. When the word line is not selected, even though the transistor $Q_{D2}$ is normally turned on, the gate voltage thereof is at $V_{SS}$ which is equal to the voltage at the output end of the first word line $W_1$. Therefore, the conductance of the transistor $Q_{D2}$ is lower than that of the transistor $Q_{D2}$ when the word line is selected. Moreover the power supply voltage $V_{DD}$ is applied to the gate of the transistor $Q_{E3}$ so that the latter is turned on. As a result, the input end of the second word line $W_2$ is not increased in voltage and is maintained at almost $V_{SS}$ level. Therefore when the word line is not selected, not only the first word line $W_1$ but the second word line $W_2$ are not increased in voltage.

Next suppose that the word line be switched from the selected mode to the deselected mode. Then the output signal $\phi_s$ from the row decoder 3 rises to $V_{DD}$ so that the transistor $Q_{E1}$ is turned on while the transistor $Q_I$ is turned off. As a result the potential at the input end of the first word line $W_1$ drops to $V_{SS}$. The voltage $V_{SS}$ is propagated as a deselection signal to the output end of the first word line $W_1$ with a predetermined time constant. When the potential $V_{w1}$ drops, the transistor $Q_{E2}$ is turned off. The transistor $Q_{D1}$ increases the gate voltage of the transistor $Q_{E3}$ so that the latter is turned on. As a result, the potential at the input end of the second word line $W_2$ falls to $V_{SS}$ through the transistor $Q_{E3}$, whereby the word line is placed into the deselected state. Furthermore, the first control signal $\phi_{w1}$ falls so that the potential at the input end of the second word line $W_2$ falls through the D type transistor $Q_{D2}$. Therefore in the deselection mode, the potential of at the input end of the second word line $W_2$ falls through the transistors $Q_{E3}$ and $Q_{D2}$, whereby the word line is rapidly driven into the deselected state. The time when the deselection operation is started becomes faster because of the transistor $Q_{D2}$ which does not include a time delay of the first word line $W_1$.

Seventh Embodiment, FIG. 12

In FIG. 12 is shown a seventh embodiment of the present invention which is an improvement of the sixth embodiment so that the power consumption may be lowered. Therefore, instead of the transistor $Q_{D2}$ which constitutes the first switching circuit 9, an E type transistor $Q_{E5}$ is used and an E type transistor $Q_{E6}$ which constitutes a transfer gate is interconnected between the gate of the transistor $Q_{E4}$ and the output end of the first word line $W_1$. Except these transistors $Q_{E5}$ and $Q_{E6}$ the seventh embodiment is substantially similar in construction to the sixth embodiment as shown in FIG. 11.

It should be noted that the seventh embodiment (FIG. 12) is of the low power consumption type as compared with the sixth embodiment as shown in FIG. 11, not as compared with the semiconductor memory devices comprising C-MOS transistors.

That is, in the case of the deselected state, both transistors $Q_{E3}$ and $Q_{D1}$ of the sixth embodiment are turned on. Therefore, the current flows from the first control signal $\phi_{w1}$ which is at $V_{DD}$ to the power supply $V_{SS}$ through them. Of a plurality of word lines of a memory device, only one word line is selected while the remaining word lines are in deselected state. Therefore, the overall power consumption caused by the current flows through the transistors $Q_{D2}$ and $Q_{E3}$ is high.

This problem can be solved by turning the transistor $Q_{D2}$ off when the word line associated with the transistor $Q_{D2}$ is in deselection. For this purpose, in the seventh embodiment, instead of the transistor $Q_{D2}$, the E type transistor $Q_{E5}$ is used. Then as far as the voltage $V_{w1}$ at the output end of the first word line $W_1$ is $V_{SS}$, the gate voltage $V_g$ of the transistor $Q_{E5}$ is $V_{SS}$ so that the transistor $Q_{E5}$ is kept turned off. The influences to the selection operation in such arrangement as described above can be solved in the following manner.

When the potential $V_{w1}$ at the output end of the first word line $W_1$ rises to some extent in the case of the select mode, the pull-up voltage on the first word line $W_1$ is applied to the gate of the transistor $Q_{E5}$ so that the latter is turned on. In this case, when the first control signal $\phi_{w1}$ is increased to $V_{DD}$, the gate voltage of the transistor $Q_{E5}$ is further increased by the capacitance coupling effect of the gate capacitance so that the conductance is increased accordingly. The first signal $\phi_{w1}$ must rise to $V_{DD}$ after the transistor $Q_{E5}$ has been driven into the conduction state. The reason is as follows. When the first control signal $\phi_{w1}$ rises to $V_{DD}$ after the transistor $Q_{E5}$ has been driven into the conduction state, a large capacitance is produced between the inverted gate and drain of the transistor $Q_{E5}$ so that the gate voltage $V_G$ is increased in response to the rise of the drain voltage $\phi_{w1}$ of the transistor $Q_{E5}$ due to the capacitor coupling. As a result, the conductance of the transistor $Q_{E5}$ is increased and consequently the potential of the second word line $W_2$ is increased. That the transistor $Q_{E5}$ is turned on so that the source voltage is increased means that the gate voltage of the transistor $Q_{E5}$ is further increased due to the bootstrap effect. Thus the transistor $Q_{E5}$ will not be turned off and the source voltage is increased to $V_{DD}$ so that the potential of the second word line $W_2$ is increased, whereby the word line is selected.

According to the present embodiment, the word-line select operation can be smoothly effected and the power consumption is lowered. When the word line is deselected, the potential of the word line can be rapidly lowered through the transistors $Q_{E5}$ and $Q_{E3}$ as with the sixth embodiment.

Furthermore, instead of the E type transistor $Q_{E5}$, an intrinsic type transistor with the threshold voltage close to 0 V may be used, as shown in FIG. 13, so that the conductance of the first switching circuit when the latter is turned on is increased. As a result, the select and deselect operations can be made at higher speed. In FIG. 13, $Q_I'$ is an intrinsic type transistor.

Eighth Embodiment, FIG. 14

In FIG. 14 is shown an eighth embodiment of the present invention which is substantially similar in construction to the second embodiment as shown in FIG. 7 and which is different from the sixth embodiment as shown in FIG. 11 in that the second switching circuit 11 is also connected to the terminal end of the second word line $W_2$ and is controlled in response to the second control signal $\phi_{w2}$.

When the word line is deselected in response to the rise of the second control signal $\phi_{w2}$ to $V_{DD}$, the transistor $Q_{E4}$ is turned on so that the potential of the second word line $W_2$ falls not only from its input end through the transistors $Q_{E3}$ and $Q_{D2}$ but also from its terminal end through the transistor $Q_{E4}$. As a result, the potential of the second word line $W_2$ can be rapidly dropped to $V_{SS}$. Thus the high speed switching from the select state to the deselected state can be ensured.

Ninth Embodiment, FIG. 15

In FIG. 15 is shown a ninth embodiment of the present invention which is substantially similar in construction to the seventh embodiment except that the second switching circuit 11 is also connected to the terminal end of the second word line $W_1$ and is controlled in response to the second control signal $\phi_{w2}$. The mode of operation of the ninth embodiment is substantially similar to that of the eighth embodiment so that no further description shall be made in this specification.

It is clear that various modifications of the sixth through ninth embodiments can be effected in view of the description of the first through fifth embodiments so that no further description shall be made in this specification.

What is claimed is:

1. A semiconductor memory device of the type in which memory cells are arranged in row and column directions and the memory cells in one row are interconnected by a word line while the memory cells in one column are interconnected by bit line, comprising:

a word line being physically divided in the lengthwise direction into a first word line and a second word line which are electrically separated from each other;

a first switching circuit means, interconnected between said first and second word lines, for causing the potential of said second word line to assume a predetermined select level in response to a select signal propagated on said first word line when a word line is selected and, for causing the potential of said second word line to assume a predetermined non-select level in synchronism with a first deselect signal when a word line is deselected; and a second switching circuit means connected to said second word line for causing the potential of said second word line to drop to the predetermined deselect level in synchronism with a second deselect signal different from said first deselect signal.

2. A semiconductor memory device as set forth in claim 1 wherein an inverter for amplifying a select and deselect signal propagated on said first word line is interconnected between said first word line and said first switching circuit.

3. A semiconductor memory device as set forth in claim 2 wherein said inverter comprises a C-MOS circuit comprising two kinds of MOS transistors having mutually opposite polarities.

4. A semiconductor memory device as set forth in claim 1 wherein an inverter for amplifying a select and a deselect signal propagated on said first word line is interconnected between said first word line and said second switching circuit.

5. A semiconductor memory device as set forth in claim 4 wherein said inverter comprises an E/D circuit which comprises a depletion type MOS transistor and an enhancement type MOS transistor.

6. A semiconductor memory device as set forth in claim 3 wherein each of said first and second switching circuits comprises two kinds of MOS transistors having mutually opposite polarities.

7. A semiconductor memory device as set forth in claim 6 wherein said two kinds of MOS transistors with opposite polarities in said first and second switching circuits have their gates connected together.

8. A semiconductor memory device as set forth in claim 5 wherein each of said first and second switching circuits comprises MOS transistors with the same polarity.

9. A semiconductor memory device as set forth in claim 8 wherein said first switching circuit comprises a depletion type MOS transistor and wherein said second switching circuit comprises an enhancement type MOS transistor.

10. A semiconductor memory device as set forth in claim 1 wherein said first deselect signal applied to said second switching circuit is propagated on said first word line.

11. A semiconductor memory device as set forth in claim 7 wherein a switching circuit which performs the same function as said second switching circuit and which comprises a transistor having the same polarity as the transistor of said second switching circuit, is connected to the end terminal of said second word line.

12. A semiconductor memory device as set forth in claim 6 wherein the second deselect signal applied to said second switching circuit has opposite phase to the first deselect signal applied to said first switching circuit.

13. A semiconductor memory device as set forth in claim 12 wherein a switching circuit which performs the same function as said second switching circuit and which comprises a transistor having the same polarity as the transistor of said second switching circuit, is connected to an end terminal of said second word line; and wherein the second deselect signal is applied to both said second switching circuit and said switching circuit.

14. A semiconductor memory device as set forth in claim 8 wherein said first and second switching circuits comprise a MOS transistor whose threshold voltage is substantially equal to zero and an enhancement type MOS transistor, respectively.

15. A semiconductor memory device as set forth in claim 9 wherein the gate of said depletion type MOS transistor which constitutes said first switching circuit is connected to an end terminal of said first word line, and the output from said inverter which amplifies the select signal propagated on said first word line is connected to the gate of said enhancement type MOS transistor which constitutes said second switching circuit.

16. A semiconductor memory device as set forth in claim 8 wherein both said first and second switching circuits comprise an enhancement type MOS transistor; the gate of the enhancement type MOS transistor of said first switching circuit is connected through another enhancement type MOS transistor to the end terminal of said first word line; and the gate of said enhancement MOS transistor which constitutes said second switching circuit is connected to the output of said inverter which amplifies the select signal propagated on said first word line.

17. A semiconductor memory device as set forth in claim 15 wherein a switching circuit which performs the same function as said second switching circuit and which comprises a MOS transistor with the same polarity as the transistor of said second switching circuit, is connected to the end terminal of said second word line; and wherein the second deselect signal applied to said switching circuit has opposite phase to the first deselect signal applied to said first switching circuit.

18. A semiconductor memory device as set forth in claim 16 wherein a switching circuit which performs the same functions as said second switching circuit and which comprises a MOS transistor with the same polarity as the transistor of said second switching circuit, is connected to the end terminal of said second word line; and wherein the second deselect signal applied to said switching circuit has opposite phase to the first deselect signal applied to said first switching circuit.

19. A semiconductor memory device as set forth in claim 1 wherein said second switching circuit is connected only to an end terminal of said second word line.

* * * * *